US009048230B2

(12) United States Patent
Cho et al.

(10) Patent No.: US 9,048,230 B2
(45) Date of Patent: *Jun. 2, 2015

(54) HALF-BRIDGE PACKAGE WITH A CONDUCTIVE CLIP

(71) Applicant: International Rectifier Corporation, El Segundo, CA (US)

(72) Inventors: Eung San Cho, Torrance, CA (US); Chuan Cheah, Torrance, CA (US); Andrew N. Sawle, East Grinstead (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/221,518

(22) Filed: Mar. 21, 2014

(65) Prior Publication Data

US 2014/0203419 A1    Jul. 24, 2014

Related U.S. Application Data

(63) Continuation of application No. 13/279,052, filed on Oct. 21, 2011, now Pat. No. 8,680,627.

(60) Provisional application No. 61/461,110, filed on Jan. 14, 2011.

(51) Int. Cl.
*H01L 23/495* (2006.01)
*H01L 23/00* (2006.01)

(52) U.S. Cl.
CPC .... *H01L 23/49575* (2013.01); *H01L 23/49524* (2013.01); *H01L 23/49562* (2013.01); *H01L 24/34* (2013.01); *H01L 2224/48247* (2013.01);

(Continued)

(58) Field of Classification Search
CPC .............. H01L 23/49575; H01L 23/5386; H01L 23/52
USPC ................................................. 257/666, 777
See application file for complete search history.

(56) References Cited

U.S. PATENT DOCUMENTS

| 7,618,896 B2 * | 11/2009 | Joshi et al. ................... 438/728 |
| 7,902,809 B2 | 3/2011 | Briere |
| 8,253,224 B2 | 8/2012 | Hu |
| 8,426,952 B2 * | 4/2013 | Cho et al. ..................... 257/666 |
| 8,431,927 B2 * | 4/2013 | Kim et al. ..................... 257/43 |
| 8,674,670 B2 | 3/2014 | Briere |

(Continued)

FOREIGN PATENT DOCUMENTS

| DE | 10 2005 055 761 | 5/2007 |
| DE | 10 2009 006 152 | 7/2009 |

OTHER PUBLICATIONS

U.S. Appl. No. 61/461,110, filed Jan. 14, 2011, Cho.

*Primary Examiner* — Douglas Menz
(74) *Attorney, Agent, or Firm* — Farjami & Farjami LLP

(57) ABSTRACT

According to an exemplary embodiment, a stacked half-bridge package includes a control transistor having a control drain for connection to a high voltage input, a control source coupled to a common conductive clip, and a control gate for being driven by a driver IC. The stacked half-bridge package also includes a sync transistor having a sync drain for connection to the common conductive clip, a sync source coupled to a low voltage input, and a sync gate for being driven by the driver IC. The control and sync transistors are stacked on opposite sides of the common conductive clip with the common conductive clip electrically and mechanically coupling the control source with the sync drain, where the common conductive clip has a conductive leg for providing electrical and mechanical connection to an output terminal leadframe.

20 Claims, 6 Drawing Sheets

(52) U.S. Cl.
CPC ............ *H01L 2224/49111* (2013.01); *H01L 2924/01013* (2013.01); *H01L 2924/01029* (2013.01); *H01L 2924/01033* (2013.01); *H01L 24/48* (2013.01); *H01L 24/49* (2013.01); *H01L 2924/014* (2013.01); *H01L 2924/13091* (2013.01); *H01L 2224/37147* (2013.01); *H01L 2224/73221* (2013.01); *H01L 2924/13064* (2013.01); *H01L 2924/30107* (2013.01)

(56) References Cited

U.S. PATENT DOCUMENTS

| | | |
|---|---|---|
| 2006/0169976 A1 | 8/2006 | Kameda |
| 2008/0061396 A1 | 3/2008 | Havanur |
| 2009/0108467 A1 | 4/2009 | Otremba |
| 2009/0141203 A1* | 6/2009 | Son et al. ............ 349/39 |
| 2009/0315026 A1* | 12/2009 | Jeong et al. ............ 257/43 |

* cited by examiner

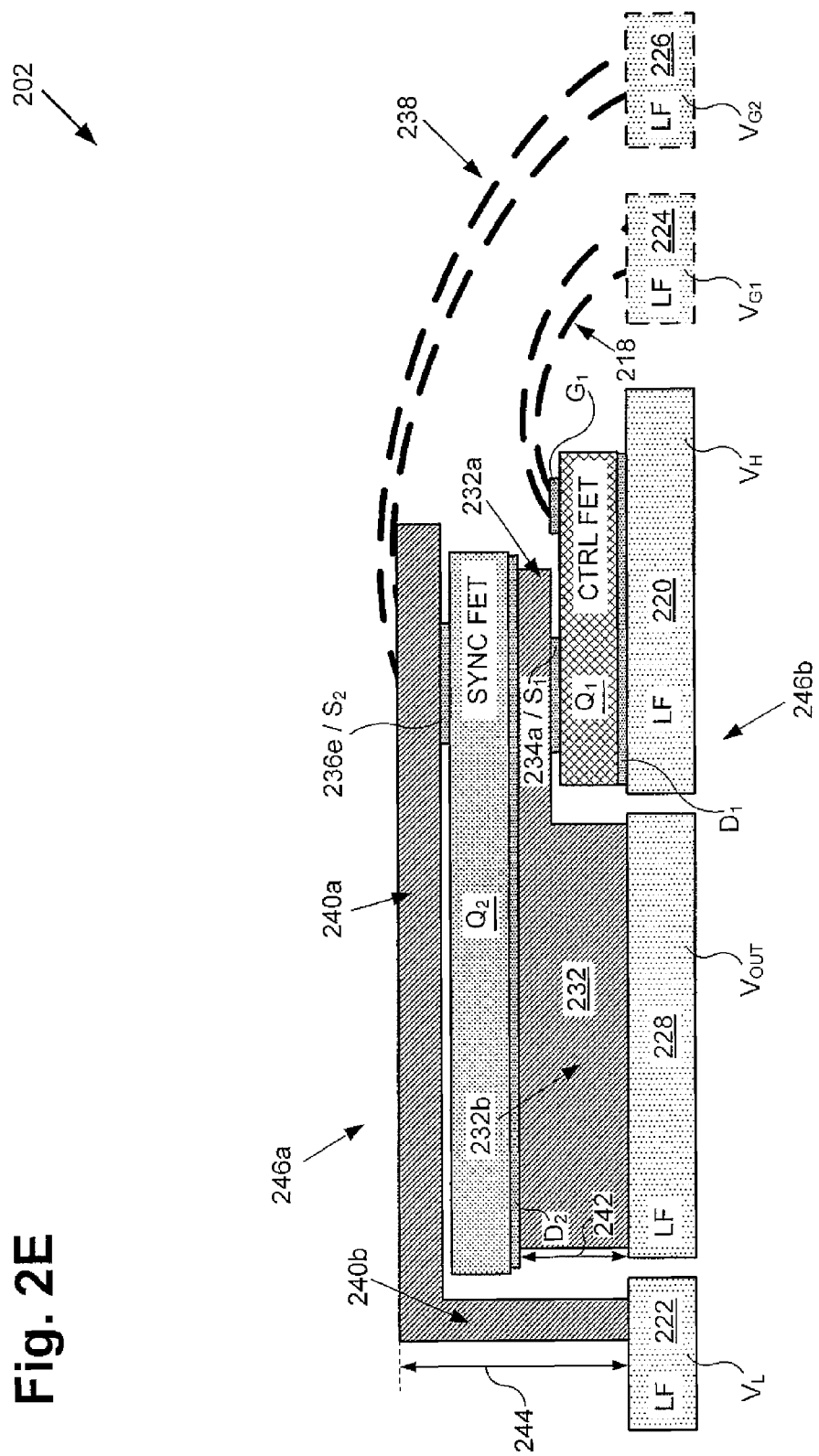

9,048,230 B2

HALF-BRIDGE PACKAGE WITH A CONDUCTIVE CLIP

This is a continuation of application Ser. No. 13/279,052 filed Oct. 21, 2011.

The present application claims the benefit of and priority to a pending provisional application titled "Stacked Packaging Architecture with Reduced Form Factor and Increased Current Density with Application to Power Transistor Packaging," Ser. No. 61/461,110 filed on Jan. 14, 2011. The disclosure in that pending provisional application is hereby incorporated fully by reference into the present application.

Moreover, application Ser. No. 11/986,848, filed on Nov. 27, 2007, titled "DC/DC Converter Including a Depletion Mode Power Switch," now U.S. Pat. No. 7,902,809; and pending application Ser. No. 12/928,102, filed on Dec. 3, 2010, titled "DC/DC Converter with Depletion-Mode III-Nitride Switches," and Ser. No. 12/927,341, filed on Nov. 12, 2010, titled "Semiconductor Package with Metal Straps," are hereby incorporated fully by reference into the present application.

BACKGROUND OF THE INVENTION

1. Field of the Invention

The present invention relates generally to semiconductor devices. More particularly, the present invention relates to packaging of semiconductor devices.

2. Background Art

To allow for high efficiency power conversion, power converters, such as buck converters, commonly employ power switching circuits in which a high side power transistor and a low side power transistor are connected to form a half-bridge. One such power converter that is frequently employed is a synchronous buck converter, where the high side transistor is a control transistor and the low side transistor is a synchronous transistor. The control transistor and the synchronous transistor are typically formed on their respective separate dies, i.e. a control transistor die and a synchronous transistor die, that are connected in a package (i.e. co-packaged) to form the half bridge.

One approach to connecting the control transistor and the synchronous transistor in a package would be to arrange the control transistor and the synchronous transistor side by side on a substrate, such as a printed circuit board (PCB). However, this arrangement would result in the package having a large footprint, as the package must be large enough to accommodate footprints of the control transistor and the synchronous transistor. Furthermore, conductive traces on the PCB could be used to connect the control transistor and the synchronous transistor so as to form the half-bridge. However, the conductive traces would form long routing paths on the PCB, causing high parasitic inductance and resistance. Thus, this approach to packaging the control transistor and the synchronous transistor would result in a package having a large form factor where the package significantly degrades performance of the half bridge.

What is needed is an approach to packaging control and synchronous transistors that is capable of achieving packages having a small form factor where the packages do not significantly degrade performance of the half-bridge.

SUMMARY OF THE INVENTION

A stacked half-bridge package with a common conductive clip, substantially as shown in and/or described in connection with at least one of the figures, and as set forth more completely in the claims.

BRIEF DESCRIPTION OF THE DRAWINGS

FIG. 2E illustrates a cross sectional view of a portion of a stacked half-bridge package, according to one embodiment of the invention.

DETAILED DESCRIPTION OF THE INVENTION

The present application is directed to a stacked half-bridge package with a common conductive clip. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
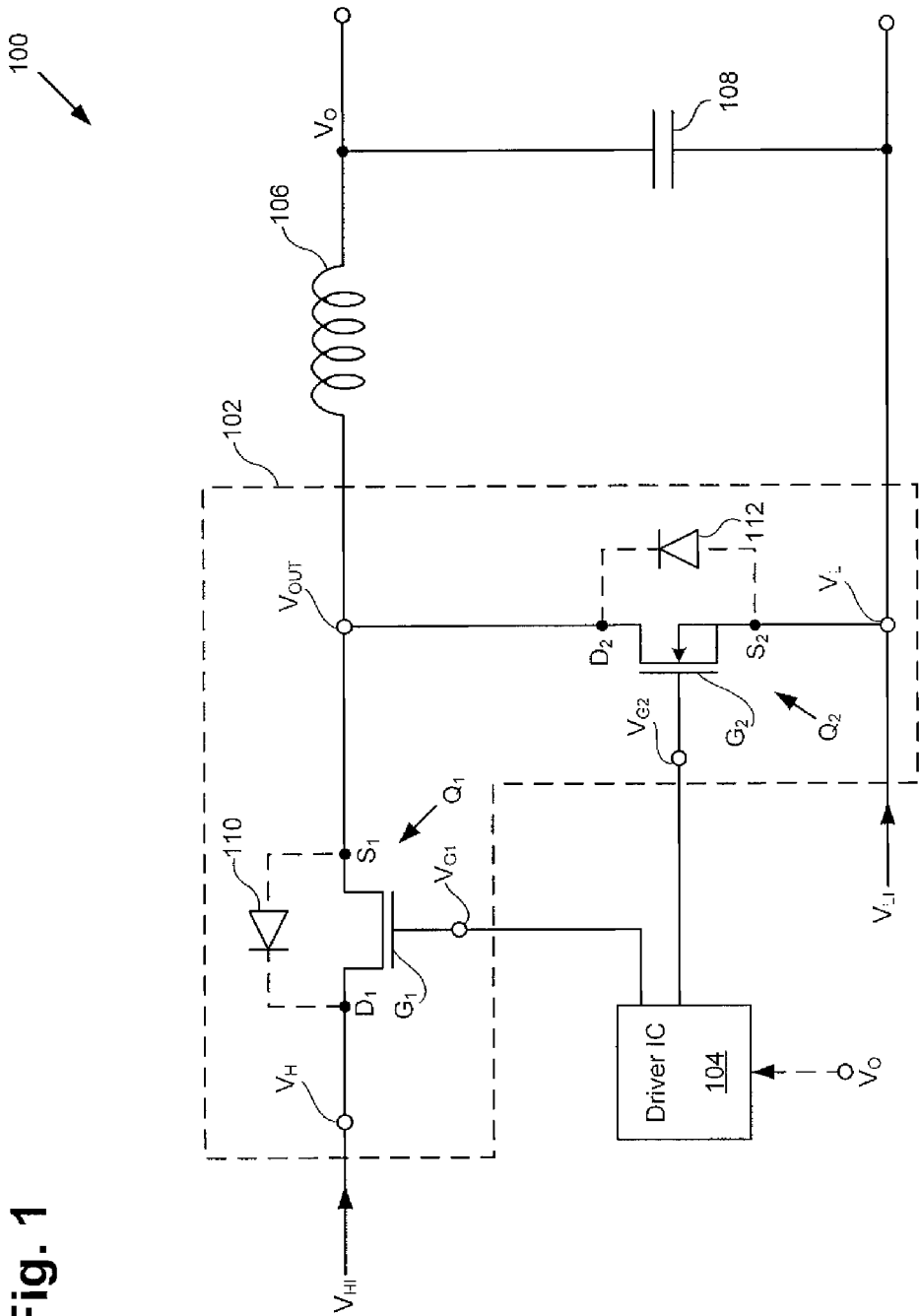
FIG. 1 shows an exemplary circuit schematic of a synchronous buck converter, according to one embodiment of the invention.

FIG. 1 shows an exemplary circuit schematic of synchronous buck converter 100 including half-bridge 102, which is formed in a stacked half-bridge package 102, according to an embodiment of the invention, and is thus also referred to as "stack half-bridge package" 102 or "half-bridge package" 102 in the present application. Synchronous buck converter 100 also includes, driver integrated circuit (IC) 104, output inductor 106, and output capacitor 108.

Half-bridge 102 includes control transistor $Q_1$ and synchronous transistor $Q_2$ (also referred to as "sync transistor"), high voltage input terminal $V_H$, low voltage input terminal $V_L$, output terminal $V_{OUT}$, control gate terminal $V_{G1}$, and sync gate terminal $V_{G2}$.

In half-bridge 102, high voltage input terminal $V_H$ receives high voltage input $V_{HI}$, which can be, for example, a direct current (DC) voltage. Low voltage input terminal $V_L$ receives low voltage input $V_{LI}$, which can be, for example, ground. Also in half-bridge 102, control gate terminal $V_{G1}$ receives a control gate signal from driver IC 104 for driving control transistor $Q_1$. Similarly, sync gate terminal $V_{G2}$ receives a sync gate signal from driver IC 104 for driving sync transistor $Q_2$. Driver IC 104 may drive control transistor $Q_1$ and sync transistor $Q_2$ utilizing any suitable method. As a specific example, in one embodiment, driver IC 104 can vary a duty cycle of the sync and control gate signals responsive to a measurement of output voltage $V_O$ of synchronous buck converter 100 to maintain a desired output voltage $V_O$, regardless of changes in high voltage input $V_{HI}$. It will be appreciated that in other embodiments, output voltage $V_O$ is not measured in synchronous buck converter 100.

Control transistor $Q_1$ includes control source $S_1$, control drain $D_1$, and control gate $G_1$. Sync transistor $Q_2$ includes sync source $S_2$, sync drain $D_2$, and sync gate $G_2$. In various embodiments of the present invention, control transistor $Q_1$ and sync transistor $Q_2$ can be any combination of an enhancement more transistor and a depletion mode transistor. For example, in one embodiment, control transistor $Q_1$ and sync transistor $Q_2$ are both depletion mode transistors. Control transistor $Q_1$ and sync transistor $Q_2$ can be P-channel or N-channel transistors. Also, control transistor $Q_1$ and sync transistor $Q_2$ can be field-effect transistors (FETs). In one embodiment, at least one of control transistor $Q_1$ and sync transistor $Q_2$ is a silicon FET. However, at least one of control transistor $Q_1$ and sync transistor $Q_2$ may also comprise a non-silicon FET or any other FET in general. In one embodiment, at least one of control transistor $Q_1$ and sync transistor $Q_2$ is a metal-oxide-semiconductor field-effect transistor (MOSFET). At least one of control transistor $Q_1$ and sync transistor $Q_2$ can also be, as an example, a high electron mobility transistor (HEMT), such as a GaN HEMT.

Control transistor $Q_1$ has control drain $D_1$ for connection to high voltage input $V_{HI}$ through high voltage input terminal $V_H$ of half-bridge 102. Control transistor $Q_1$ also has control source $S_1$ coupled to output terminal $V_{OUT}$ of half-bridge 102. Also, control transistor $Q_1$ has control gate $G_1$ coupled to control gate terminal $V_{G1}$ of half-bridge 102 for being driven by driver IC 104.

Sync transistor $Q_2$ has sync drain $D_2$ for connection to output terminal $V_{OUT}$ of half-bridge 102. Sync transistor $Q_2$ also has sync source $S_2$ coupled to low voltage input $V_{LI}$ through low voltage input terminal $V_L$ of half-bridge 102. Also, sync transistor $Q_2$ has sync gate $G_2$ coupled to sync gate terminal $V_{G2}$ of half-bridge 102 for being driven by driver IC 104.

In some embodiments, at least one of control transistor $Q_1$ and sync transistor $Q_2$ can be connected to a diode. For example, FIG. 1 shows optional diodes 110 and 112. In the embodiment shown in FIG. 1, diode 110 is coupled to control source $S_1$ and control drain $D_1$, such that diode 110 is in parallel with control transistor $Q_1$. Similarly, diode 112 is coupled to sync source $S_2$ and sync drain $D_2$, such that diode 112 is in parallel with control transistor $Q_2$. In some embodiments, at least one of diodes 110 and 112 can be connected with a reverse polarity to that shown in FIG. 1. In various embodiments, diodes 110 and 112 can be internal to or external to control transistor $Q_1$ and sync transistor $Q_2$. As an example, in one embodiment, control transistor $Q_1$ and sync transistor $Q_2$ are MOSFETs and diodes 110 and 112 are respective body diodes of control transistor $Q_1$ and sync transistor $Q_2$.

Control transistor $Q_1$ and sync transistor $Q_2$ are commonly included on respective dies (i.e. a control transistor die and a synchronous transistor die). The respective dies may include other components, for example, diode 110 may be on the control transistor die and diode 112 may be on the synchronous transistor die. These other components may also be provided external to the respective dies and can be, for example, on a different die.

Synchronous buck converter 100 illustrates one power converter, which can benefit from including stacked half-bridge package 102, in accordance with embodiments of the present invention. However, half-bridge 102 is not limited to being included in a synchronous buck converter and can be included in other types of power converters.

In accordance with embodiments of the present invention, control transistor $Q_1$ and sync transistor $Q_2$ can be connected in a stacked half-bridge package, which includes stacked half-bridge package 102, while achieving a small footprint with low parasitic inductance and resistance. Thus, the stacked half-bridge package can have a small form factor where the stacked half-bridge package does not significantly degrade performance of half-bridge 102.

FIGS. 2A-2D illustrate selective top views of stacked half-bridge package 202, corresponding to stacked half-bridge package 102 in FIG. 1, in accordance with one embodiment of the present invention. Various features of stacked half-bridge package 202 are not shown in FIGS. 2A-2D for clarity of description. FIG. 2E illustrates a cross sectional view of a portion of stacked half-bridge package 202, according to one embodiment of the invention. The cross sectional view shown in FIG. 2E corresponds to a cross section along line 2E-2E in FIGS. 2A-2D.

Figure 2A:
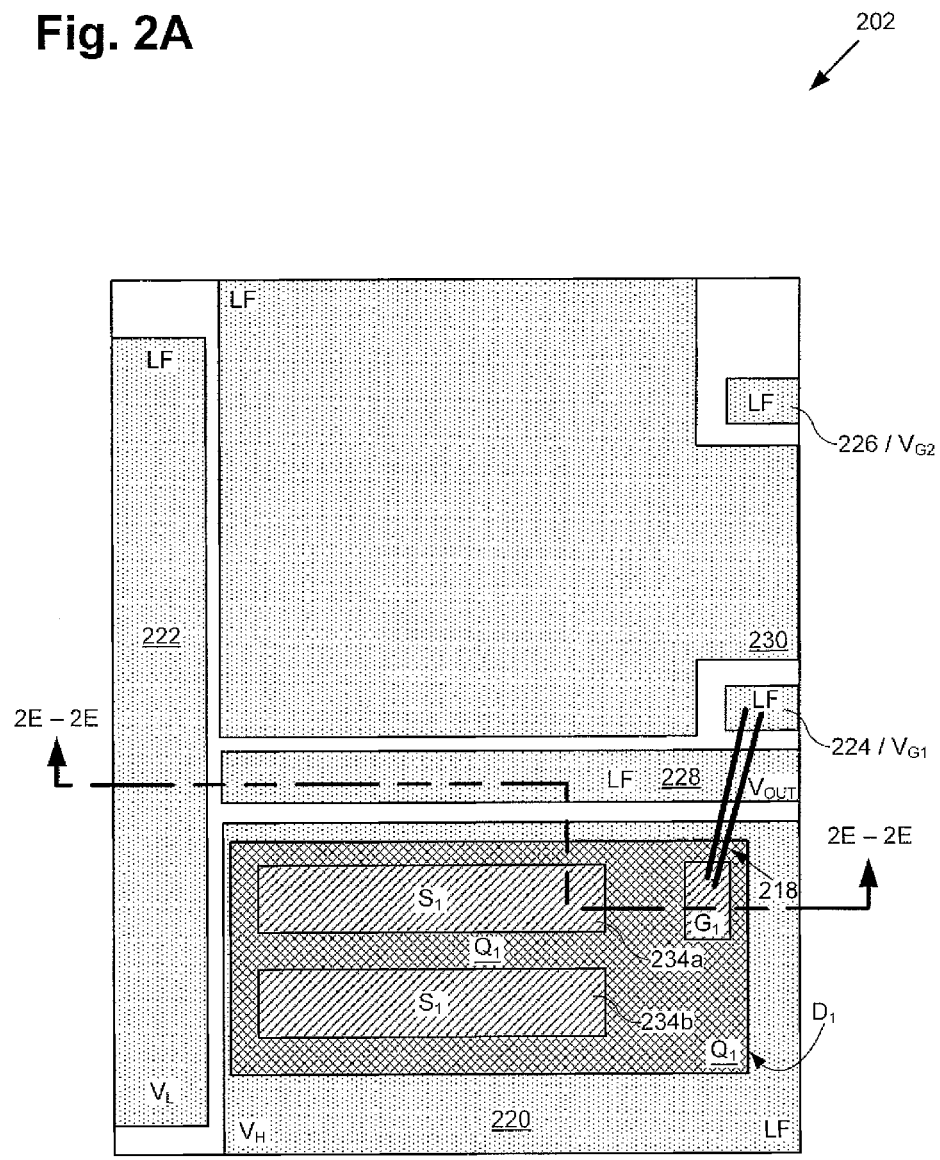
FIG. 2A illustrates a selective top view of a stacked half-bridge package, according to one embodiment of the invention.

FIG. 2A shows control drain leadframe 220, sync source leadframe 222, control gate leadframe 224, sync gate leadframe 226, output terminal leadframe 228, support leadframe 230, and control transistor $Q_1$ of stacked half-bridge package 202.

Control transistor $Q_1$ in FIGS. 2A-2E corresponds to control transistor $Q_1$ in FIG. 1. Control transistor $Q_1$ is over control drain leadframe 220 and includes control source $S_1$, control drain $D_1$, and control gate $G_1$. Control source $S_1$ in stacked half-bridge package 202 corresponds to control source $S_1$ in FIG. 1, control gate $G_1$ in stacked half-bridge package 202 corresponds to control gate $G_1$ in FIG. 1, and control drain $D_1$ in stacked half-bridge package 202 corresponds to control drain $D_1$ in FIG. 1. In the present embodiment, control transistor $Q_1$ has top and bottom surfaces, which are opposite one another. Control drain $D_1$ is on the bottom surface and control source $S_1$ and control gate $G_1$ are on the top surface.

FIG. 2A shows control source $S_1$ and control gate $G_1$ are on the top surface of control transistor $Q_1$, and indicates control drain $D_1$ on the bottom surface thereof. In the present embodiment, control drain $D_1$ is provided with a control drain pad that substantially covers an entirety of the bottom surface of control transistor $Q_1$. Control source $S_1$ is provided with a plurality of control source pads 234a and 234b (also referred to collectively as "control source pads 234"). Also, control gate $G_1$ is provided with a gate pad.

It is noted that in some embodiments, control drain $D_1$, control source $S_1$, and control gate $G_1$ are not provided as shown in stacked half-bridge package 202. For example, control drain $D_1$, control source $S_1$, and control gate $G_1$ can be provided on different surfaces of control transistor $Q_1$ and can be provided using one or more pads arranged in any suitable manner. As one example, in some embodiments, a single control source pad can replace control source pads 234.

Control drain leadframe 220, sync source leadframe 222, control gate leadframe 224, sync gate leadframe 226, output terminal leadframe 228, and support leadframe 230 are electrically conductive and can comprise, for example, an easily solderable metal such as aluminum, and other solderable materials such as a metal alloy or a tri-metal. Control transistor $Q_1$ is over control drain leadframe 220, which provides mechanical and electrical connection for control drain $D_1$. In the present embodiment, control drain leadframe 220 of stacked half-bridge package 202 corresponds to high voltage input terminal $V_H$ in FIG. 1.

Also in the present embodiment, at least one control gate bondwire, such as control gate bondwires 218, provides electrical and mechanical connection for control gate $G_1$. Control gate bondwires 218 provide electrical connection between control gate $G_1$ and control gate leadframe 224. In the present embodiment, control gate leadframe 224 of stacked half-bridge package 202 corresponds to control gate terminal $V_{G1}$ in FIG. 1. It is noted that some embodiments do not include control gate leadframe 224. Furthermore, in various embodiments, something other than at least one control gate bondwire (e.g. a conductive gate clip) can provide electrical and mechanical connection for control gate $G_1$.

Figure 2B:
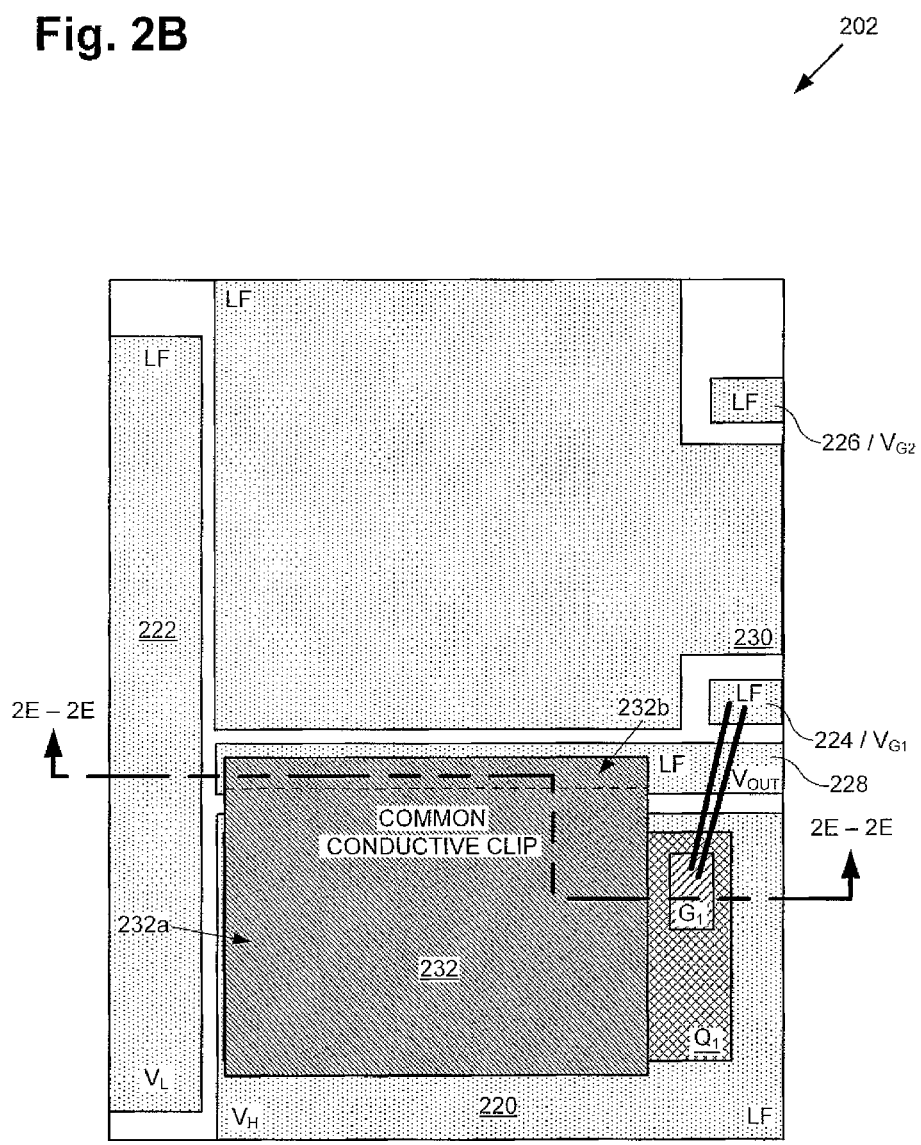
FIG. 2B illustrates a selective top view of a stacked half-bridge package, according to one embodiment of the invention.

FIG. 2B is similar to FIG. 2A, with an addition of showing common conductive clip 232 of stacked half-bridge package 202 over control drain leadframe 220 and control transistor $Q_1$. Common conductive clip 232 comprises conductive material, such as a metal or metal alloy. In one embodiment common conductive clip 232 is a copper clip. Control source $S_2$ of control transistor $Q_1$ is coupled to common conductive clip 232. Common conductive clip 232 includes conductive web 232a and conductive leg 232b. In FIG. 2B, a dashed line indicates a boundary of conductive web 232a and conductive leg 232b. In the present embodiment, conductive web 232a is over and electrically and mechanically connected to control source $S_2$ of control transistor $Q_1$ and conductive leg 232b is over and electrically and mechanically connected to output terminal leadframe 228.

Figure 2C:
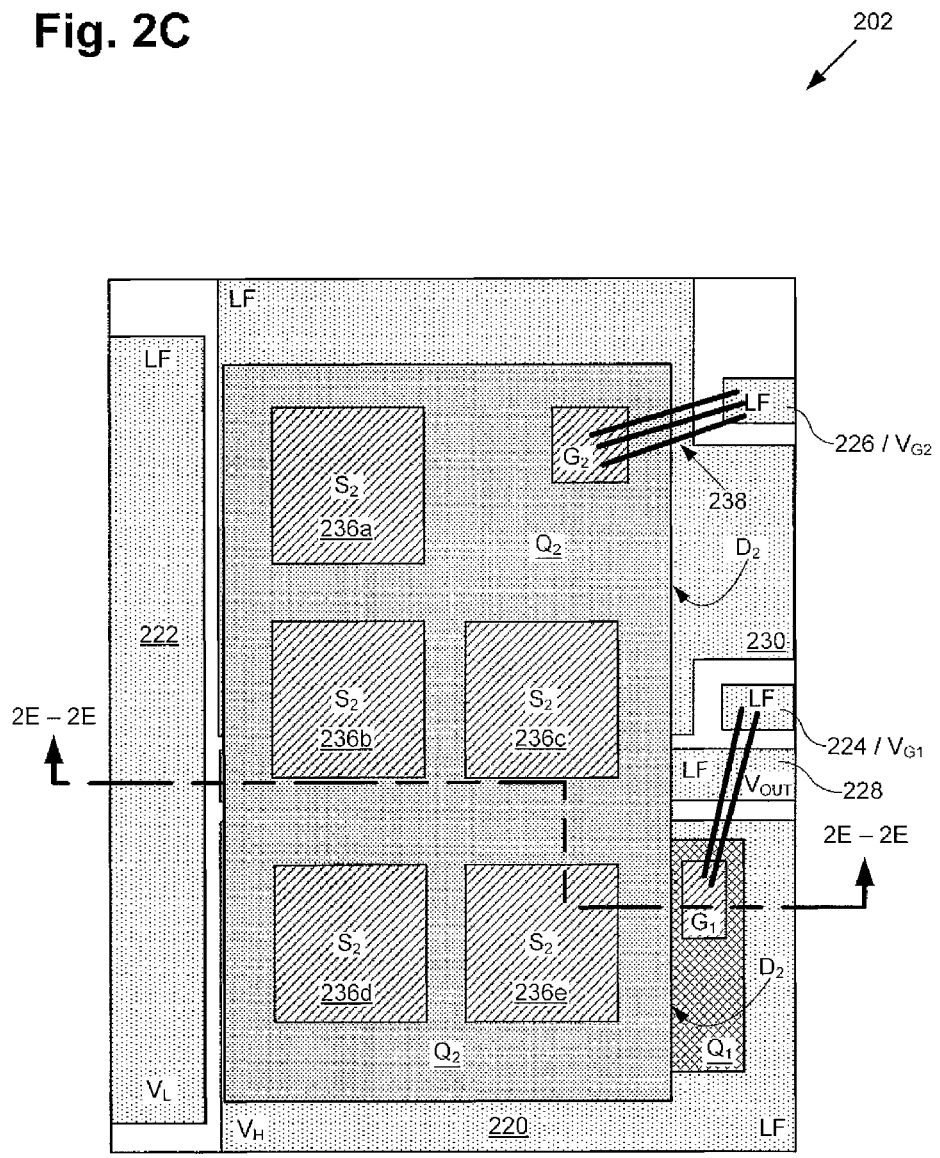
FIG. 2C illustrates a selective top view of a stacked half-bridge package, according to one embodiment of the invention.

FIG. 2C is similar to FIG. 2B, with an addition of showing sync transistor $Q_2$ of stacked half-bridge package 202 over common conductive clip 232, control drain leadframe 220, and control transistor $Q_1$. In the present embodiment, sync transistor $Q_2$ is on support leadframe 230, which acts as a mechanical support for sync transistor $Q_2$. In some embodiments, support leadframe 230 is not electrically conductive. Furthermore, it will be appreciated that support leadframe 230 is not required in stacked half-bridge package 202.

Sync transistor $Q_2$ in stacked half-bridge package 202 corresponds to sync transistor $Q_2$ in FIG. 1. Sync source $S_2$ in stacked half-bridge package 202 corresponds to sync source $S_2$ in FIG. 1, sync gate $G_2$ in stacked half-bridge package 202 corresponds to sync gate $G_2$ in FIG. 1, and sync drain $D_2$ in stacked half-bridge package 202 corresponds to sync drain $D_2$ in FIG. 1. In the present embodiment, sync transistor $Q_2$ has top and bottom surfaces, which are opposite one another. Sync drain $D_2$ is on the bottom surface and sync source $S_2$ and sync gate $G_2$ are on the top surface.

FIG. 2C shows sync source $S_2$ and sync gate $G_2$ are on the top surface of sync transistor $Q_2$, and indicates sync drain $D_2$ on the bottom surface thereof. In the present embodiment, sync drain $D_2$ is provided with a sync drain pad that substantially covers an entirety of the bottom surface of sync transistor $Q_2$. Sync source $S_2$ is provided with a plurality of control source pads 236a, 236b, 236c, 236d, and 236e (also referred to collectively as "sync source pads 236"). Also, sync gate $G_2$ is provided with a gate pad.

It is noted that in some embodiments, sync drain $D_2$, sync source $S_2$, and sync gate $G_2$ are not provided as shown in stacked half-bridge package 202. For example, sync drain $D_2$, sync source $S_2$, and sync gate $G_2$ can be provided on different surfaces of sync transistor $Q_2$ and can be provided using one or more pads arranged in any suitable manner. As one example, in some embodiments, a single sync source pad can replace sync source pads 236.

Sync transistor $Q_2$ is over common conductive clip 232, which is electrically and mechanically connected to sync transistor $Q_2$. More particularly, sync transistor $Q_2$ has sync drain $D_2$ connected to common conductive clip 232. Conductive web 232a of common conductive clip 232 provides electrical and mechanical coupling of control source $S_1$ with sync drain $D_2$.

Thus, control and sync transistors $Q_1$ and $Q_2$ are stacked on opposite sides of common conductive clip 232, with common conductive clip 232 electrically and mechanically coupling control source $S_1$ with sync drain $D_2$. Advantageously, a short current path is formed between control source $S_1$ and sync drain $D_2$ that has low parasitic inductance and resistance (See FIG. 2D). As such, stacked half-bridge package 202 does not significantly degrade performance of half-bridge 102 in FIG. 1. Furthermore, stacked half-bridge package 202 has a small footprint that does not incorporate footprints of control transistor $Q_1$ and sync transistor $Q_2$ individually, thereby allowing for a small form factor.

As common conductive clip 232 has conductive leg 232b (See FIGS. 2B and 2E) for providing electrical and mechanical connection to output terminal leadframe 228, output terminal leadframe 228 corresponds to output terminal $V_{OUT}$ in FIG. 1. Thus, in the present embodiment, output terminal leadframe 228 is an output terminal of stacked half-bridge package 202.

Also in the present embodiment, at least one sync gate bondwire, such as sync gate bondwires 238, provides electrical and mechanical connection for sync gate $G_2$. Sync gate bondwires 238 provide electrical connection between sync gate $G_2$ and sync gate leadframe 226. In the present embodiment, sync gate leadframe 226 of stacked half-bridge package 202 corresponds to sync gate terminal $V_{G2}$ in FIG. 1. It is noted that some embodiments do not include sync gate leadframe 226. Furthermore, in various embodiments, something other than at least one sync gate bondwire (e.g. a conductive gate clip) can provide electrical and mechanical connection for sync gate $G_2$.

Figure 2D:
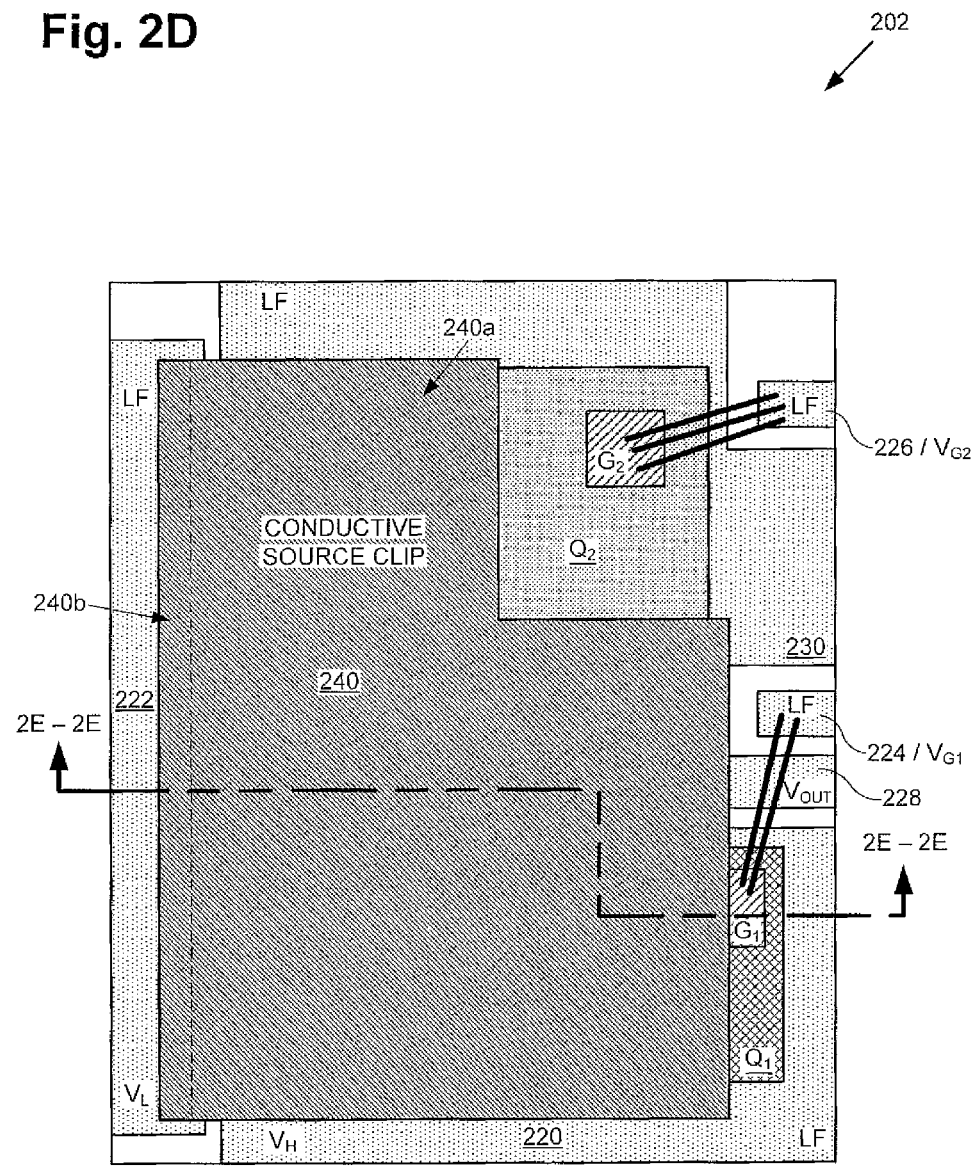
FIG. 2D illustrates a selective top view of a stacked half-bridge package, according to one embodiment of the invention.

FIG. 2D is similar to FIG. 2C, with an addition of showing conductive source clip 240 of stacked half-bridge package 202 over sync transistor $Q_2$, common conductive clip 232, control transistor $Q_1$, and control drain leadframe 220. Conductive source clip 240 comprises conductive material, such as a metal or metal alloy. In one embodiment conductive source clip 240 is a copper clip. Conductive source clip 240 includes source clip web 240a and source clip leg 240b and provides connection between sync source $S_2$ and sync source leadframe 222. In FIG. 2G, a dashed line indicates a boundary of source clip web 240a and source clip leg 240b. In the present embodiment, sync source leadframe 222 corresponds to low voltage input terminal $V_L$ in FIG. 1 with source clip leg portion 240b being over and electrically and mechanically connected to sync source leadframe 222 and source clip web 240a being over and electrically and mechanically connected to sync source $S_2$ of sync transistor $Q_2$.

As noted above, FIG. 2E illustrates a cross sectional view of a portion of stacked half-bridge package 202 corresponding to a cross section along line 2E-2E in FIGS. 2A-2D. However, some features which are not in the cross section along line 2E-2E in FIGS. 2A-2D are included in FIG. 2E for completeness and are indicated using dashed lines. Those features are control gate bondwires 218, control gate leadframe 224, sync gate bondwires 238, and sync gate leadframe 226. Sync gate bondwires 238 are electrically connected to gate $G_2$ of sync transistor $Q_2$, which is behind and not shown in FIG. 2E.

FIG. 2E shows that conductive source clip 240 is connected to sync source $S_2$ at topside 246a of stacked half-bridge package 202 and shows control drain leadframe 220, sync source leadframe 222, control gate leadframe 224, sync gate leadframe 226, and output terminal leadframe 228 at bottomside 246b of stacked half-bridge package 202. In one embodiment, hermetic sealant, such as a molding compound, can encapsulate stacked half-bridge package 202 (not shown in FIG. 2E). However, control drain leadframe 220, sync source leadframe 222, control gate leadframe 224, sync gate leadframe 226, and output terminal leadframe 228 are exposed on bottomside 246b of stacked half-bridge package 202 and thus, available for electrical connection.

FIG. 2E shows conductive leg 232b of common conductive clip 232 is of thickness 242 that is greater than that of control transistor $Q_1$ and that of conductive web 232b. FIG. 2E also shows source clip leg 240b of conductive source clip 240 is of thickness 244 that is greater than that of control transistor $Q_1$, sync transistor $Q_2$, and conductive web 232a combined. In the present embodiment, respective top and bottom surfaces of control drain leadframe 220, sync source leadframe 222, control gate leadframe 224, sync gate leadframe 226, and output terminal leadframe 228 can thereby be substantially flush with one another, as shown in FIG. 2E. As such, stacked half-bridge package 202 can easily be mounted on and electrically connected to a substrate (not shown in FIGS. 2A-2E). Furthermore, control drain leadframe 220, sync source leadframe 222, control gate leadframe 224, sync gate leadframe 226, and output terminal leadframe 228 can be of substantially a same thickness and in one embodiment, are formed from a shared leadframe.

Thus, as described above with respect to FIGS. 1 and 2A-2E, embodiments of the present invention can provide for a stacked half-bridge package including a control transistor and a sync transistor. The control transistor and the sync transistor can advantageously be connected in a half-bridge with low parasitic inductance and resistance. Furthermore, the control transistor and the sync transistor can be connected with the stacked half-bridge package having a small footprint. As such, among other advantages not specifically described herein, the stacked half-bridge package can have a small form factor, where the stacked half-bridge package does not significantly degrade performance of the half-bridge.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A half-bridge package comprising:
a control transistor having a control drain for connection to a high voltage input, a control source coupled to a common conductive clip, and a control gate;
a sync transistor having a sync drain for connection to said common conductive clip, a sync source coupled to a low voltage input, and a sync gate;
said control and sync transistors being situated on opposite sides of said common conductive clip, said common conductive clip coupling said control source with said sync drain, wherein said common conductive clip provides connection to an output terminal leadframe.

2. The half-bridge package of claim 1, wherein a conductive web of said common conductive clip provides said coupling of said control source with said sync drain.

3. The half-bridge package of claim 1, wherein a conductive leg of said common conductive clip is of a thickness greater than that of said control transistor.

4. The half-bridge package of claim 1, wherein a control drain leadframe provides connection for said control drain.

5. The half-bridge package of claim 1, wherein a conductive source clip provides connection between said sync source and a sync source leadframe.

6. The half-bridge package of claim 5, wherein said conductive source clip comprises a source clip leg that is of a thickness greater than that of said sync transistor.

7. The half-bridge package of claim 1, wherein a conductive source clip comprises a source clip web that is connected to said sync source and including a source clip leg that is connected to a sync source leadframe.

8. The half-bridge package of claim 1, wherein a conductive source clip is connected to said sync source at a topside of said stacked half-bridge package.

9. The half-bridge package of claim 1, wherein respective bottom surfaces of a sync source leadframe, a control drain leadframe, and said output terminal leadframe are substantially flush with one another.

10. The half-bridge package of claim 1, wherein respective top surfaces of a sync source leadframe, a control drain leadframe, and said output terminal leadframe are substantially flush with one another.

11. The half-bridge package of claim 1, wherein at least one control gate bondwire provides connection for said control gate.

12. The half-bridge package of claim 11, wherein said at least one control gate bondwire provides connection between said control gate and a control gate leadframe.

13. The half-bridge package of claim 1, wherein at least one sync gate bondwire provides connection for said sync gate.

14. The half-bridge package of claim 13, wherein said at least one sync gate bondwire provides connection between said sync gate and a sync gate leadframe.

15. The half-bridge package of claim 1, wherein said sync source comprises a plurality of sync source pads.

16. The half-bridge package of claim 1, wherein said control transistor has top and bottom surfaces, said control drain being on said bottom surface and said control source and said control gate being on said top surface.

17. The half-bridge package of claim 1, wherein said sync transistor has top and bottom surfaces, said sync drain being on said bottom surface and said sync source and said sync gate being on said top surface.

18. The half-bridge package of claim 1, wherein said output terminal leadframe is an output terminal of said half-bridge package.

19. The half-bridge package of claim 1, wherein respective bottom surfaces of a sync source leadframe, a control drain leadframe, a sync gate leadframe, a control gate leadframe, and said output terminal leadframe are substantially flush with one another.

20. The half-bridge package of claim 1, wherein a sync source leadframe, a control drain leadframe, a sync gate leadframe, a control gate leadframe, and said output terminal leadframe are or substantially a same thickness.

* * * * *